United States Patent
Balteanu et al.

(10) Patent No.: US 10,727,790 B2
(45) Date of Patent: Jul. 28, 2020

(54) DRIVER AMPLIFIER WITH PROGRAMMABLE SINGLE-ENDED AND DIFFERENTIAL OUTPUTS

(71) Applicant: QUALCOMM Incorporated, San Diego, CA (US)

(72) Inventors: Andreea Balteanu, La Jolla, CA (US); Mahim Ranjan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/963,806

(22) Filed: Apr. 26, 2018

(65) Prior Publication Data
US 2019/0334483 A1 Oct. 31, 2019

(51) Int. Cl.
| | |
|---|---|
| H03F 3/04 | (2006.01) |
| H03F 1/12 | (2006.01) |
| H03F 3/195 | (2006.01) |
| H03F 3/213 | (2006.01) |
| H03F 3/68 | (2006.01) |
| H04B 1/04 | (2006.01) |

(52) U.S. Cl.
CPC ............. *H03F 1/12* (2013.01); *H03F 3/195* (2013.01); *H03F 3/213* (2013.01); *H03F 3/68* (2013.01); *H03F 2200/396* (2013.01); *H03F 2200/414* (2013.01); *H03F 2200/421* (2013.01); *H03F 2200/451* (2013.01); *H03F 2200/541* (2013.01); *H04B 1/04* (2013.01)

(58) Field of Classification Search
CPC ... H03F 1/12; H03F 3/213; H03F 3/68; H03F 3/195

USPC .................................. 330/289, 301, 51, 144
See application file for complete search history.

(56) References Cited

U.S. PATENT DOCUMENTS

| | | | |
|---|---|---|---|
| 7,893,758 B2* | 2/2011 | Parsa .................... | H04L 27/364 329/358 |
| 7,944,322 B2 | 5/2011 | Roufoogaran | |
| 8,688,058 B2 | 4/2014 | Narathong et al. | |
| 8,724,736 B2 | 5/2014 | Bellaouar et al. | |
| 8,902,006 B2* | 12/2014 | Yoshikawa .............. | H03H 7/25 330/254 |
| 9,331,734 B2 | 5/2016 | Chakraborty et al. | |

(Continued)

OTHER PUBLICATIONS

Cho Y., et al., "Transformer Based Dual-power-mode CMOS Power Amplifier for Handset Applications", 2014 9th European Microwave Integrated Circuit Conference, European Microwave Association—EUMA, Oct. 6, 2014 (Oct. 6, 2014), pp. 436-439, XP032712567, DOI: 10.1109/EUMIC.2014.6997886 [retrieved on Dec. 23, 2014].

(Continued)

*Primary Examiner* — Khanh V Nguyen
*Assistant Examiner* — Khiem D Nguyen
(74) *Attorney, Agent, or Firm* — Qualcomm Incorporated/Seyfarth Shaw LLP

(57) ABSTRACT

An output driver with programmable single-ended and differential outputs includes a first switch, a first output attenuator, and a programmable attenuator. The first switch is coupled in a shunt configuration to a first path of a differential output of a first amplifier. The first output attenuator is included in the first path and is coupled to the first switch in accordance with the shunt configuration. The programmable attenuator is included in a second path of the differential output of the first amplifier.

20 Claims, 7 Drawing Sheets

(56) References Cited

U.S. PATENT DOCUMENTS

2008/0079650 A1     4/2008    Constantinidis et al.
2014/0361847 A1    12/2014    Goldblatt et al.

OTHER PUBLICATIONS

International Search Report and Written Opinion—PCT/US2019/028529—ISA/EPO—dated Jul. 25, 2019.
"Method for a Dual-mode Output Driver 1-20 Circuit with Reduced Parasitic Capacitance", Ip.com Journal No. IPCOM000132457D, Ip.com Inc., West Henrietta, NY, US, Dec. 16, 2005 (Dec. 16, 2005), pp. 1-7, XP013112127, ISSN: 1533-0001.
Ou W., et al., "A 2A-GHz Dual-mode Resizing Power Amplifier with a Constant Conductance Output Matching", 2017 30th IEEE International System-On-Chip Conference (SOCC), IEEE, Sep. 5, 2017 (Sep. 5, 2017), pp. 258-261, XP033286045, DOI: 10.1109/S0CC.2017.8226053 [retrieved on Dec. 18, 2017].

* cited by examiner

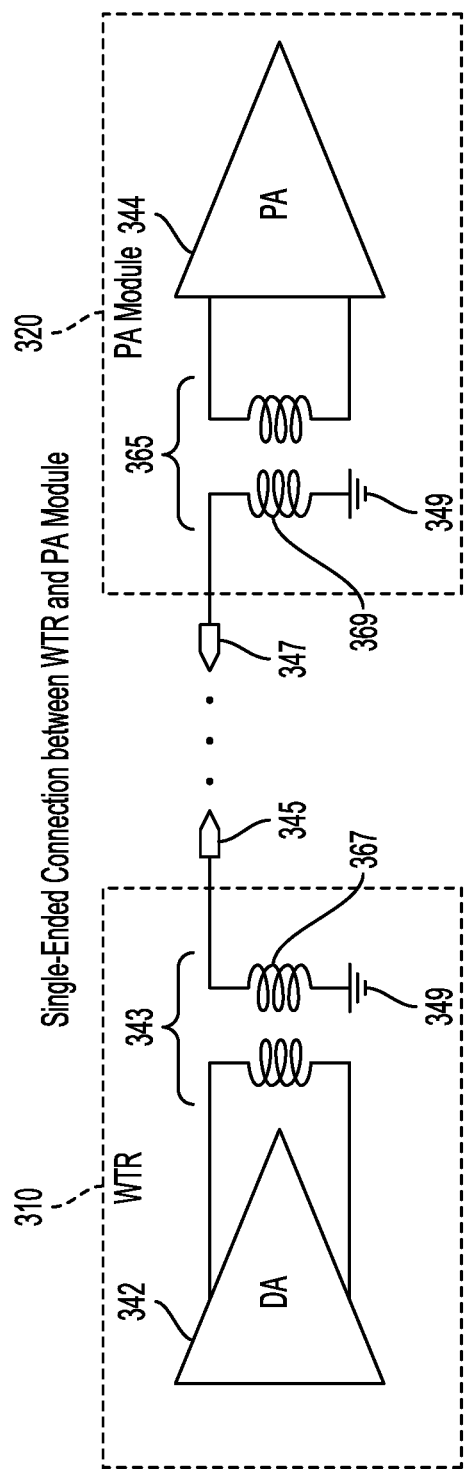

DRIVER AMPLIFIER WITH PROGRAMMABLE SINGLE-ENDED AND DIFFERENTIAL OUTPUTS

TECHNICAL FIELD

The present disclosure generally relates to radio frequency integrated circuit (RFIC) transmitters. More specifically, the present disclosure relates to a driver amplifier with programmable single-ended and differential outputs.

BACKGROUND

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA). The receiver may include a low noise amplifier (LNA), and the transmitter and receiver may include variable gain amplifiers (VGAs).

A transmitter may have an amplifier module that may include multiple amplifiers (e.g., a driver amplifier and a power amplifier). In some wireless transmitters of the wireless communication device, a driver amplifier has a differential-to-single-ended transformer (e.g., a balun) as its load and can only provide single-ended outputs. Some power amplifiers are differential power amplifiers and therefore specify a single-ended-to-differential balun at their input when driven in accordance with a single-ended input. Currently, output drivers (e.g., driver amplifiers) provide either differential or single-ended outputs. It may be desirable to implement output drivers that provide both the differential outputs and the single-ended outputs.

SUMMARY

An output driver with programmable single-ended and differential outputs includes a first switch, a first output attenuator, and a programmable attenuator. The first switch is coupled in a shunt configuration to a first path of a differential output of a first amplifier. The first output attenuator is included in the first path and is coupled to the first switch in accordance with the shunt configuration. The programmable attenuator is included in a second path of the differential output of the first amplifier.

An output driver with programmable single-ended and differential outputs includes first means for selectively driving a first signal of a differential signal from a first amplifier to a ground or through a first path to a load coupled to the first amplifier. The output driver further includes a first output attenuator and a programmable attenuator. The first driving means is coupled in a shunt configuration to a first path of a differential output of a first amplifier. The first output attenuator is included in the first path and is coupled to the first driving means in accordance with the shunt configuration. The programmable attenuator is included in a second path of the differential output of the first amplifier.

A method for programmably selecting a single-ended or differential driver output may include driving a first signal of a differential signal to a first output terminal of a first path of a differential output of an amplifier via a first output attenuator when operating in a differential mode. The method also includes driving the first signal of the differential signal to ground when operating in a single-ended mode. The method further includes driving a second signal of the differential signal through a second path of the differential output of the amplifier to a second output terminal via a programmable attenuator.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 3 is a circuit diagram illustrating a single-ended connection between a driver amplifier and a power amplifier.

FIG. 4 is a circuit diagram illustrating a differential connection between a driver amplifier and a power amplifier.

DETAILED DESCRIPTION

Figure 1:
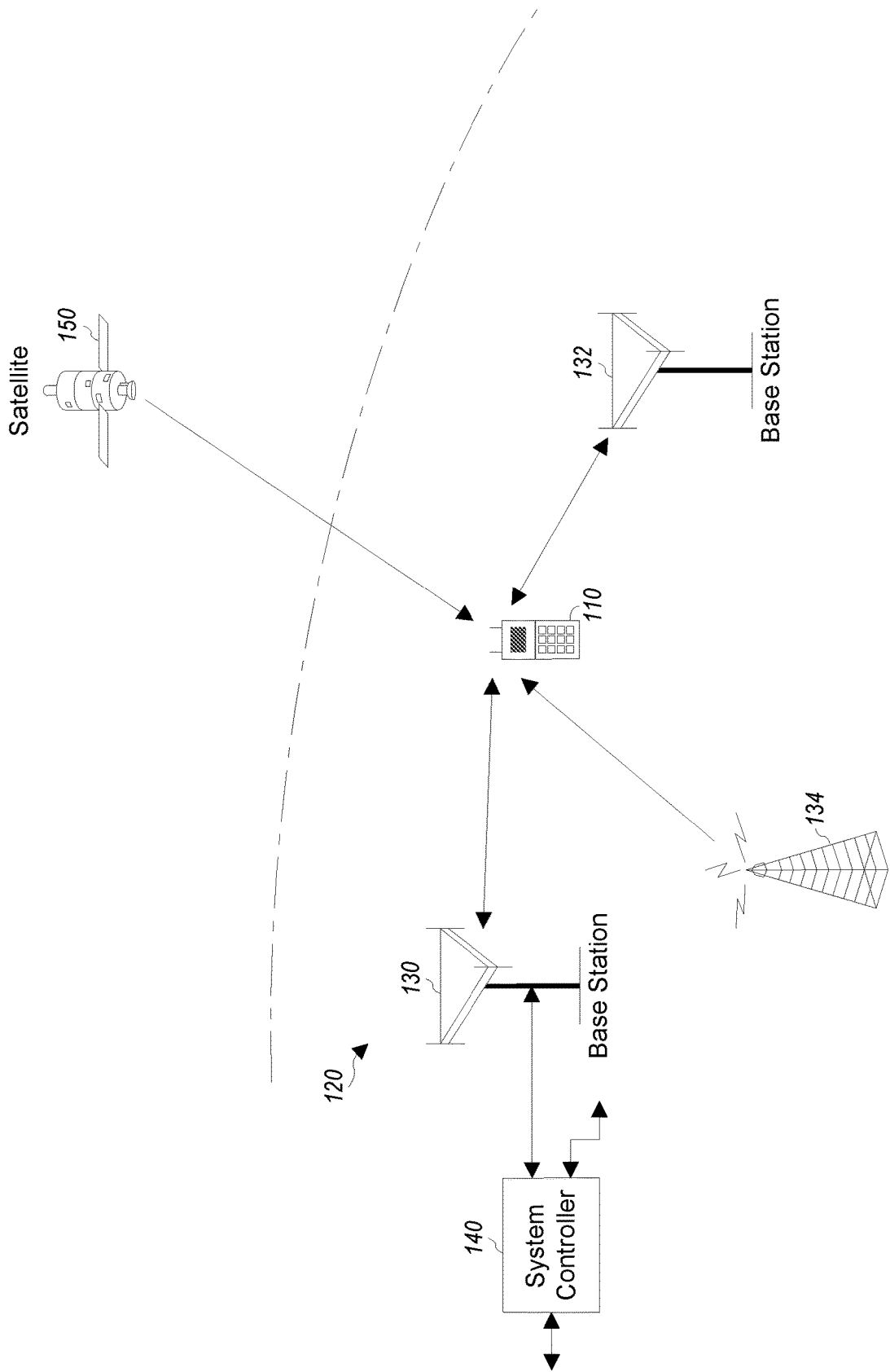
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Many electronic implementations include output drivers (e.g., a driver amplifier (DA)) to drive many electronic circuits. An exemplary electronic implementation may include a transmitter with a power amplifier stage for transmission of electronic signals. The power amplifier stage may include a power amplifier module and a wireless transmitter. The wireless transmitter may include a first amplifier (e.g., the driver amplifier) while the power amplifier module includes a second amplifier (e.g., a power amplifier (PA)). The power amplifier stage provides amplification for a user equipment. The power amplifier stage may provide amplification for a transmitter of the user equipment.

The power amplifier may operate with differential and/or single-ended signals at its input. When the power amplifier operates with differential input signals, two complementary signals with approximately equal magnitudes but opposing phases are received and amplified by the power amplifier. In addition, the driver amplifier may also operate with single-ended signals. When the power amplifier operates with single-ended signals, a single signal is received and amplified by the power amplifier. A balun or transformer may couple single-ended or differential signals from the driver amplifier to the power amplifier. For example, a first transformer may be coupled to the output of the driver amplifier and a second transformer may be coupled to the input of the power amplifier.

A load of the driver amplifier may include a differential-to-single-ended transformer only providing single-ended outputs. Some power amplifiers (PAs) are differential power amplifiers and therefore specify a single-ended-to-differential transformer at their input when driven in accordance with a single-ended input. By providing a differential signal from the driver amplifier, this single-ended-to-differential transformer at the PA input can be bypassed, thereby reducing losses, increasing efficiency, and reducing area that the transformer would have occupied.

Currently, output drivers provide either differential or single-ended outputs and are therefore limited. Aspects of the present disclosure provide both options in a programmable transmitter configuration. In one aspect, a programmable transmitter includes a first switch coupled in a shunt or parallel configuration to a first path of a differential output of a first amplifier (e.g., a driver amplifier). A first output attenuator is included in the first path of the differential output. The first output attenuator is coupled to the first switch in accordance with the shunt configuration. A programmable attenuator is included in a second path of the differential output of the first amplifier. In some aspects of the disclosure, the first output attenuator may also be programmable. The first output attenuator and the programmable attenuator include switches that can readily be enabled or disabled to achieve a desirable impedance (e.g., resistance) for a desirable mode of operation (e.g., single-ended mode or differential mode). For example, control signals may be provided to the attenuators to cause the values of the resistances to change. In some aspects, one or more of the attenuators may be a T-bridge attenuator.

A first signal of a differential signal is selectively driven to a first output terminal of the first path of the differential output of the first amplifier via the first output attenuator. A second signal of the differential signal is driven through the second path of the differential output of the first amplifier to a second output terminal via the programmable attenuator. For example, the first signal may have a positive polarity and the second signal may have a negative polarity or vice versa.

In one aspect of the disclosure, the first switch is controlled by a control signal that causes the first switch to be turned ON or OFF. When the first switch is turned OFF, the first signal of a differential signal is provided to the first output terminal such that the programmable transmitter operates in accordance with a differential mode. However, when the first switch is turned ON, the first signal of the differential signal is driven to a ground such that the programmable transmitter operates in accordance with a single-ended mode.

The programmable transmitter further includes a second switch coupled in a shunt configuration to the second path of the differential output of the first amplifier. In some aspects, the second switch is maintained in an OFF position to always drive the second signal of the differential signal to the second terminal instead of to the ground.

The first amplifier may be configured to drive a second amplifier (e.g., a first power amplifier) coupled to the first amplifier in accordance with either a single-ended mode when the second amplifier includes a single-ended input or a differential mode when the second amplifier includes a differential input. For example, the second amplifier is coupled to the first path of the differential output of the first amplifier and/or the second path of the differential output of the first amplifier.

Additionally, an array of power amplifiers can be paired with the programmable transmitter to increase efficiency. In one aspect of the disclosure, the programmable transmitter may be coupled to a third amplifier (e.g., a second power amplifier) in addition to the first power amplifier. The first power amplifier may be coupled to the first path and the second power amplifier may be coupled to the second path.

In one aspect of the disclosure, the differential output of the first amplifier includes a differential transformer or balun. The differential transformer includes primary windings and secondary windings. The secondary windings are configured to be paired with a single-ended load or a differential load. For example, a first transformer output is coupled to the first path and the second transformer output is coupled to the second path. The first switch is configured to drive the first signal of the differential signal to the ground such that the programmable transmitter operates in accordance with a single-ended mode.

The first switch is configured to drive the first signal of the differential signal to the first terminal instead of the ground such that the programmable transmitter operates in accordance with the differential mode. The second signal of the differential signal is driven to the second terminal instead of the ground.

Figure 8:
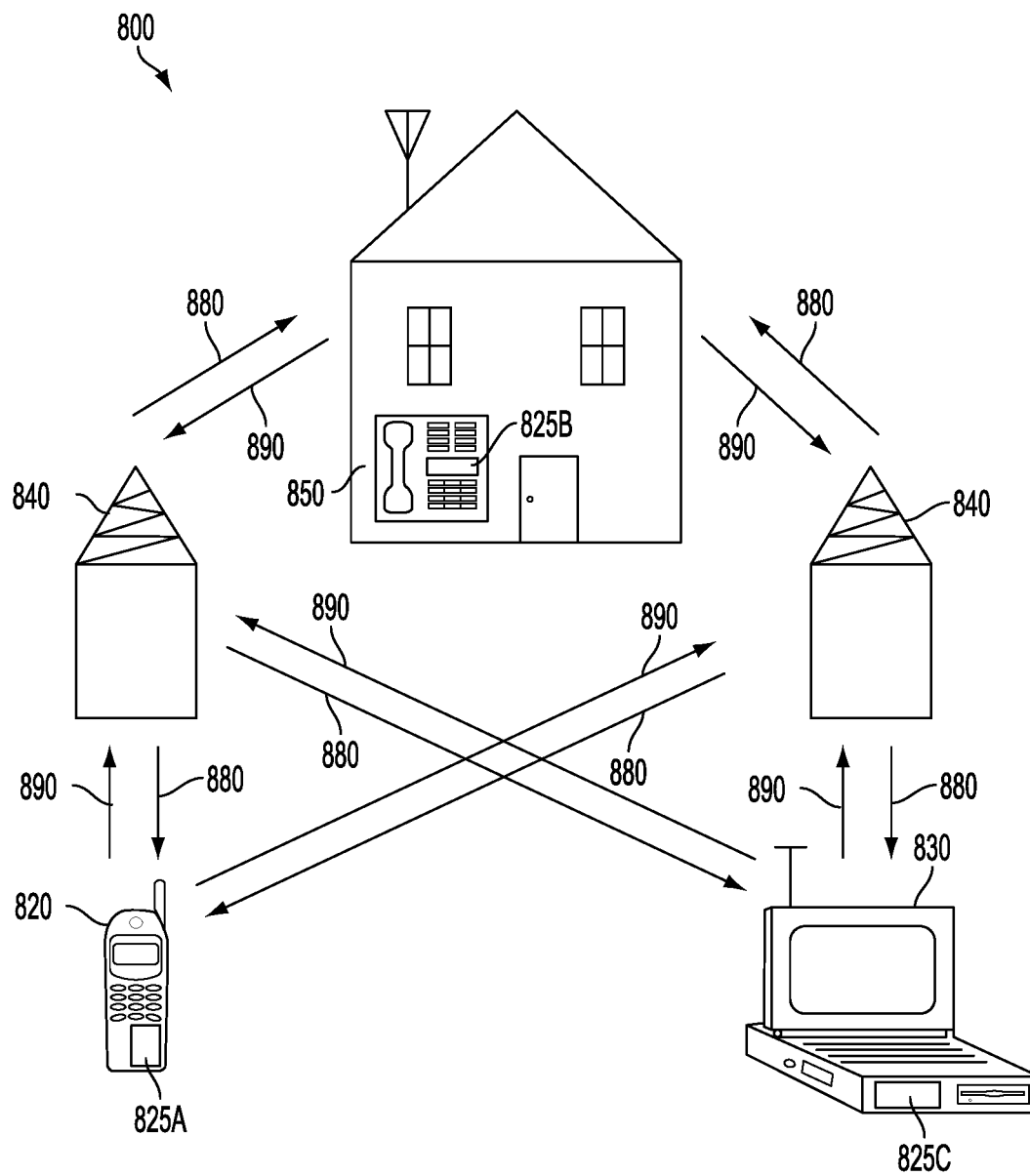
FIG. 8 is a block diagram showing an exemplary wireless communication system in which a configuration of the disclosure may be advantageously employed.

The aspects of the present disclosure may be implemented in the system of FIGS. 1 and 8. More specifically, aspects of the present disclosure may be implemented in the wireless device of FIG. 2.

FIG. 1 shows a wireless device 110 including the programmable transmitter communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.) For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

Figure 2:
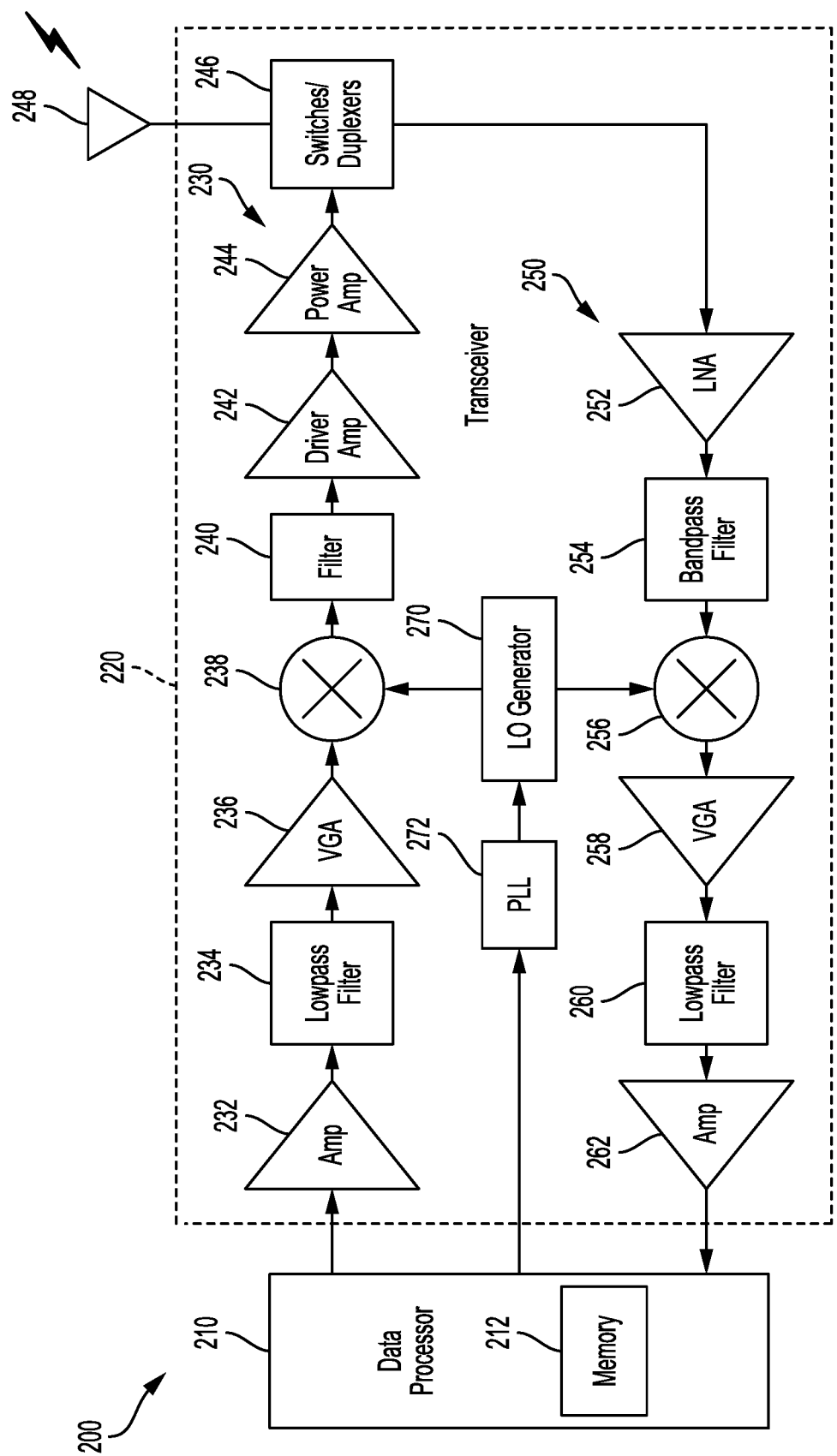
FIG. 2 shows a block diagram of the wireless device in FIG. 1, according to an aspect of the present disclosure.

FIG. 2 shows a block diagram of a wireless device 200 (e.g., wireless device 100 of FIG. 1), according to an aspect of the present disclosure. In this exemplary design, the wireless device 200 includes a data processor 210 and a transceiver 220. The transceiver 220 includes a transmitter 230 and a receiver 250 that support bi-directional wireless communication. In general, the wireless device 200 may include any number of transmitters and any number of receivers for any number of communication systems and any number of frequency bands.

In the transmit path, the data processor 210 processes data to be transmitted and provides an analog output signal to the transmitter 230. Within the transmitter 230, the analog output signal is amplified by an amplifier 232, filtered by a lowpass filter 234 to remove images caused by digital-to-analog conversion, amplified by a voltage gain amplifier (VGA) 236, and upconverted from baseband to radio frequency (RF) by a mixer 238. The upconverted signal is filtered by a filter 240, further amplified by a driver amplifier 242 and a power amplifier 244, routed through switches/duplexers 246, and transmitted via an antenna 248.

In the receive path, the antenna 248 receives signals from base stations and/or other transmitter stations and provides a received signal, which is routed through switches/duplexers 246 and provided to the receiver 250. Within the receiver 250, the received signal is amplified by a low noise amplifier (LNA) 252, filtered by a bandpass filter 254, and downconverted from RF to baseband by a mixer 256. The downconverted signal is amplified by a VGA 258, filtered by a lowpass filter 260, and amplified by an amplifier 262 to obtain an analog input signal, which is provided to the data processor 210.

FIG. 2 shows the transmitter 230 and the receiver 250 implementing a direct-conversion architecture, which frequency converts a signal between RF and baseband in one stage. The transmitter 230 and/or the receiver 250 may also implement a super-heterodyne architecture, which frequency converts a signal between RF and baseband in multiple stages. A local oscillator (LO) generator 270 generates and provides transmit and receive LO signals to mixers 238 and 256, respectively. A phase locked loop (PLL) 272 receives control information from the data processor 210 and provides control signals to the LO generator 270 to generate the transmit and receive LO signals at the proper frequencies.

A conditioning of the signals in the transmitter 230 and the receiver 250 may be performed by one or more stages of an amplifier, a filter, a mixer, etc. These circuits may be arranged differently from the configuration shown in FIG. 2. Furthermore, other circuits not shown in FIG. 2 may also be used in the transmitter and receiver. For example, matching circuits may be used to match various active circuits in FIG. 2. Some circuits in FIG. 2 may also be omitted. The transceiver 220 may be implemented on one or more analog integrated circuits (ICs), RF ICs (RFICs), mixed-signal ICs, etc. For example, the amplifier 232 through the power amplifier 244 in the transmitter 230 may be implemented on an RFIC. The driver amplifier 242 and the power amplifier 244 may also be implemented on another IC external to the RFIC.

The Data processor 210 may perform various functions for the wireless device 200, e.g., processing for transmitted and received data. A memory 212 may store program codes and data for the data processor 210. The data processor 210 may be implemented on one or more application specific integrated circuits (ASICs) and/or other ICs.

As shown in FIG. 2, a transmitter and a receiver may include various amplifiers. Each amplifier at a radio frequency (RF) may have input impedance matching and output impedance matching, which are not shown in FIG. 2 for simplicity. In FIG. 2, the driver amplifier 242 and the power amplifier 244 may be implemented in a power amplifier module. The power amplifier module may support multiple operating modes, which may be associated with different output power levels, different gains, etc. The operating modes may also be referred to as gain modes, etc. For example, the power amplifier module may support high gain mode where the driver amplifier 242 and the power amplifier 244 are both enabled, medium gain mode where only the driver amplifier 242 is enabled and the power amplifier 244 is disabled, and low gain mode where the driver amplifier 242 and the power amplifier 244 are both disabled. Finer gain steps may be achieved by varying the gain of driver amplifier 242 and/or the gain of power amplifier 244.

Aspects of the present disclosure are directed to radio frequency integrated circuit (RFIC) transmitters. For example, aspects of the present disclosure are directed to a driver amplifier capable of programmable single-ended or differential outputs. The driving amplifier may be used across different standards and applications including wide area network (WAN), wireless local area network (WLAN) and Bluetooth.

FIG. 3 is a circuit diagram 300 illustrating a single-ended connection between a driver amplifier (DA) 342 and a power amplifier (PA) 344. The circuit diagram 300 includes a wireless transmitter 310 and a power amplifier module 320. The wireless transmitter 310 includes the driver amplifier 342, a differential-to-single-ended transformer 343 (e.g., a balun), a single-ended output at a first node 345 of a secondary winding 367 of the differential-to-single-ended transformer 343, and a ground 349 coupled to another node of the secondary winding 367 of the differential-to-single-ended transformer 343. The power amplifier module 320 includes the power amplifier 344, a single-ended-to-differential transformer 365 (e.g., a balun), a single-ended input 347 at a node of a primary winding 369 of the single-ended-to-differential transformer 365, and a ground 349 coupled to another node of the primary winding 369 of the single-ended-to-differential transformer 365.

In some wireless transmitters, such as the wireless transmitter 310 of FIG. 3, the driver amplifier 342 has a differential-to-single-ended transformer 343 (e.g., a balun) as its load and can only provide single-ended outputs. Some power amplifiers (PAs), such as the power amplifier 344 of FIG. 3, are differential power amplifiers and may specify a single-ended-to-differential transformer (e.g., 365) as its input when driven in accordance with a single-ended input (e.g., via the first node 345 of the secondary winding 367).

FIG. 4 is a circuit diagram 400 illustrating a differential connection between a driver amplifier 442 and a power amplifier 444. The circuit diagram 400 includes a wireless transmitter 410 and a power amplifier module 420. The wireless transmitter 410 includes the driver amplifier 442, a differential-to-differential transformer 443 (e.g., a balun) and a differential output. A first output of the differential output may correspond to a second node 445 of a secondary winding 467 of the differential-to-differential transformer 443. A second output of the differential output may correspond to a third node 446 of the secondary winding 467 of the differential-to-differential transformer 443. The power amplifier module 420 includes the power amplifier 444 and differential input nodes 447 of the power amplifier 444. A differential signal is provided by the driver amplifier 442 at the second node 445 and the third node 446 of the differential output and subsequently at the differential input nodes 447 of the power amplifier 444.

By providing a differential signal from the wireless transmitter 410, it is unnecessary to include a balun (e.g., the single-ended-to-differential transformer 365) in front of the power amplifier 444. Eliminating the single-ended-to-differential transformer 365 reduces losses, increases efficiency, and reduces area that the balun would have occupied. Currently, output drivers provide either differential or single-ended outputs. Aspects of the present disclosure improve efficiency (even when multiple pairs of power amplifiers are paired with the output drivers) by providing both options in a programmable configuration.

Figure 5:
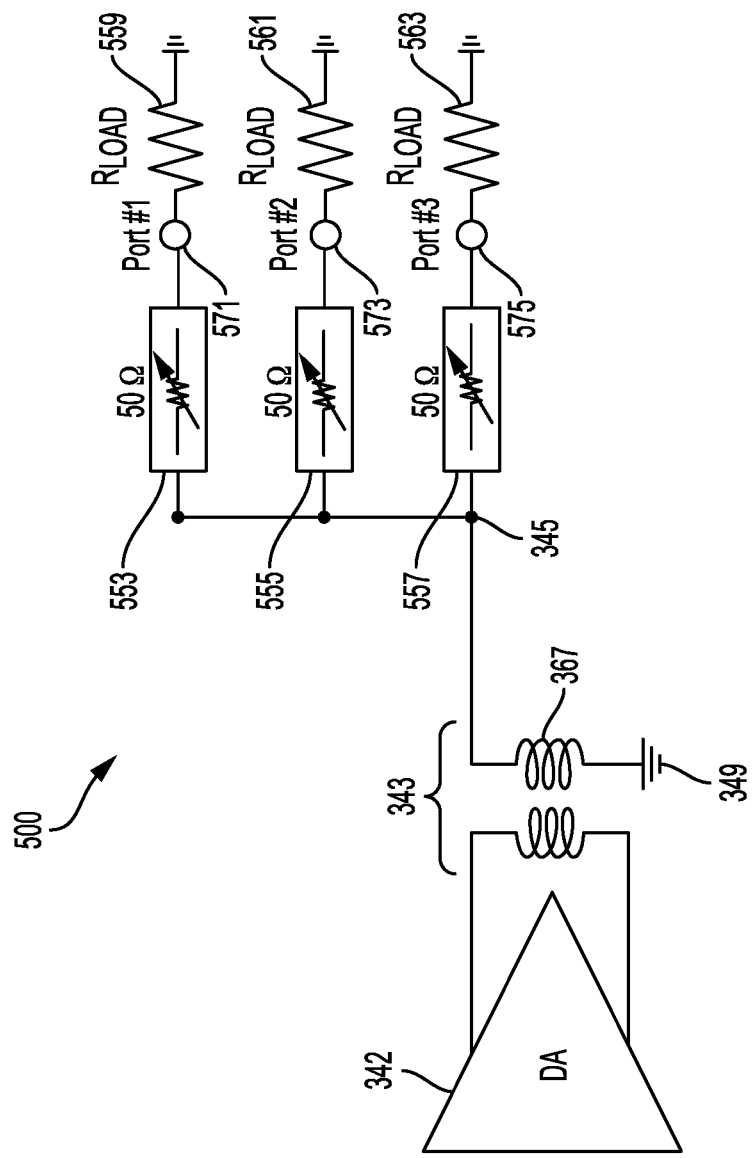
FIG. 5 is a circuit diagram illustrating a driver amplifier with multiple output ports and output attenuators to support single-ended connections to multiple loads, according to aspects of the present disclosure.

FIG. 5 is a circuit diagram 500 illustrating a driver amplifier with multiple output ports and output attenuators to support single-ended connections to multiple loads, according to aspects of the present disclosure. For illustrative purposes, some of the labelling and numbering of the devices and features of FIG. 5 are similar to those of FIG. 3.

The driver amplifier may be the driver amplifier 342 of FIG. 3 that includes the differential-to-single-ended transformer 343, which has the single-ended output at the first node 345 of the secondary winding 367 of the differential-to-single-ended transformer 343. The output attenuators may include a first attenuator 553, a second attenuator 555, and a third attenuator 557. Each of the output attenuators has a first terminal coupled to the first node 345. A second terminal 571 of the first attenuator 553 is coupled to an input of a first load 559. A second terminal 573 of the second attenuator 555 is coupled to an input of a second load 561. A second terminal 575 of the third attenuator 557 is coupled to an input of a third load 563. An output of each of the first load 559, the second load 561, and the third load 563 are coupled to the ground 349. Thus, multiple output loads (e.g., multiple power amplifiers) may be paired with the first node 345 of an output driver (e.g., a driver amplifier 342) to operate in accordance with a single-ended mode.

Figure 6:
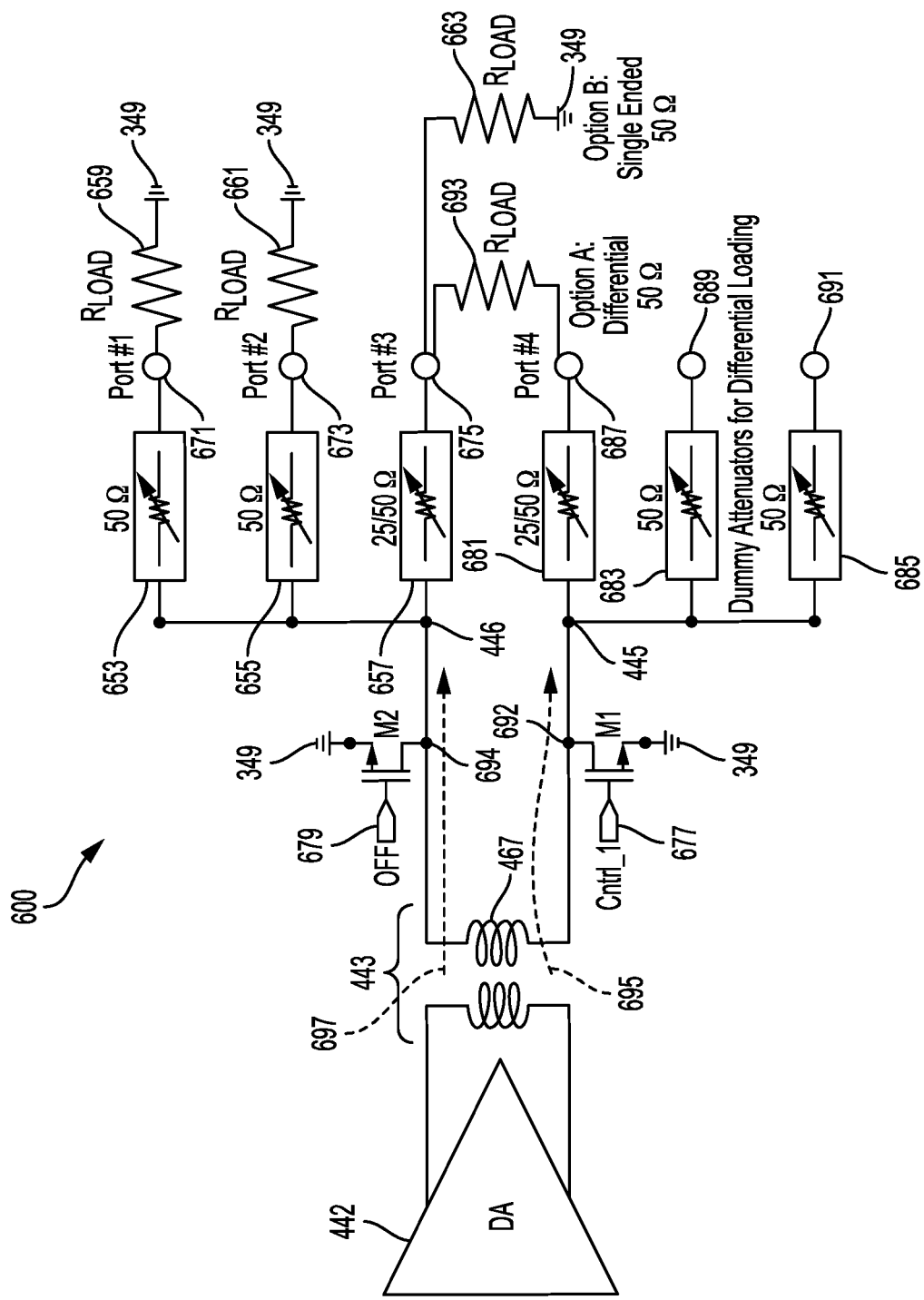
FIG. 6 illustrates a driver amplifier with programmable single-ended and differential outputs according to aspects of the present disclosure.

FIG. 6 is a programmable wireless transmitter system 600 including a driver amplifier 442 with programmable single-ended and differential outputs, according to aspects of the present disclosure. The programmable wireless transmitter system 600 is an output driver or driver amplifier with programmable single-ended and differential outputs. For illustrative purposes, some of the labelling and numbering of the devices and features of FIG. 6 are similar to those of FIG. 3, FIG. 4, and FIG. 5.

The programmable wireless transmitter system 600 includes the driver amplifier 442, the differential-to-differential transformer 443 and a programmable output that supports both a differential and a single-ended mode of operation. As noted, the first output of the differential output of the driver amplifier 442 may correspond to the second node 445 of the secondary winding 467 of the differential-to-differential transformer 443. The second output of the differential output may correspond to the third node 446 of the secondary winding 467 of the differential-to-differential transformer 443. Differential signals are provided by the driver amplifier 442 to the second node 445 and to the third node 446 and subsequently to a load, which is coupled to the driver amplifier 442. The differential signals include two complementary signals (e.g., a first signal and a second signal) with approximately equal magnitudes but opposing phases. The load may be a power amplifier or any other load to be driven by the driver amplifier 442.

Additionally, the programmable wireless transmitter system 600 includes multiple output ports and output attenuators to support single-ended connections and differential connections to multiple loads, according to aspects of the present disclosure. The output attenuators may include a first set of attenuators and a second set of attenuators. The first set of attenuators include a first attenuator 653, a second attenuator 655, and a third attenuator 657. The second set of attenuators include a fourth attenuator 681, a fifth attenuator 683, and a sixth attenuator 685. Each of the first set of attenuators have a first terminal coupled to the third node 446 of the secondary winding 467. The multiple output ports may include a second terminal 671 of the first attenuator 653, a second terminal 673 of the second attenuator 655 and a second terminal 675 of the third attenuator 657. The second terminal 671 of the first attenuator 653 is coupled to an input of a first load 659. The second terminal 673 of the second attenuator 655 is coupled to an input of a second load 661. The second terminal 675 of the third attenuator 657 is coupled to an input of a third load 663.

Each of the second set of attenuators has a first terminal coupled to the second node 445 of the secondary winding 467 of the differential-to-differential transformer 443. A second terminal 687 of the fourth attenuator 681 may be configured to receive a load (e.g., a fourth load 693) when operating in accordance with the differential mode. The fifth attenuator 683 may have a second terminal 689 configured to receive a load (not shown). The sixth attenuator 685 may also include a second terminal 691 configured to receive a load (not shown). The fifth attenuator 683 and the sixth attenuator 685 may be optional. In some aspects, however, the fifth attenuator 683 and the sixth attenuator 685 may be included to achieve symmetry with respect to the first attenuator 653 and the second attenuator 655.

In a first option, the second terminal 675 of the third attenuator 657 is coupled to an input of the third load 663 to operate in accordance with a single-ended mode. An output of each of the first load 659, the second load 661, and the third load 663 are coupled to the ground 349. In a second option, the second terminal 675 of the third attenuator 657 is coupled to a first terminal of the fourth load 693. In the second option, the second terminal 687 of the fourth attenuator 681 is coupled to a second terminal of the fourth load 693. The second option applies to the differential mode of operation.

To achieve programmability of the programmable wireless transmitter system 600, the programmable wireless transmitter system 600 may include one or more transistors or switches and programmable attenuators. For example, the programmable wireless transmitter system 600 includes a first transistor M1 and a second transistor M2. The first transistor M1 is coupled in a shunt configuration to a first path 695 of a differential output of the driver amplifier 442. The second transistor M2 is coupled in a shunt configuration to a second path 697 of the differential output of the driver amplifier 442.

The first transistor M1 may be coupled to a fourth node 692 between the secondary winding 467 and the second node 445 along the first path 695. The second transistor M2 may be coupled to a fifth node 694 between the secondary winding 467 and the third node 446 along the second path 697. The first transistor M1 may be controlled by a control signal 677 and the second transistor M2 may be controlled by a control signal 679. The control signal 677 and the control signal 679 respectively cause the first transistor M1 and the second transistor M2 to be turned ON or OFF.

A first signal of the differential signal is selectively driven to the second node 445 of the secondary winding 467 of the differential-to-differential transformer 443. For example, the first signal of the differential signal is either driven to the second node 445 or ground 349 based on whether the first transistor M1 is ON or OFF. When the control signal 677 causes the first transistor M1 to be OFF, the first signal of the differential signal is driven to the second node 445. However, when the control signal 677 causes the first transistor M1 to be ON, the first signal of the differential signal is driven to ground 349 and the driving amplifier operates in single-ended mode.

A second signal of the differential signal may be driven to the third node 446 of the secondary winding 467 of the differential-to-differential transformer 443. At least a portion of the second signal is subsequently driven to one or more loads (e.g., the first load 659, the second load 661, the third load 663, and/or the fourth load 693) via the first attenuator 653, the second attenuator 655, and/or the third attenuator 657. In some aspects, the control signal 679 causes the transistor M2 to be maintained in an OFF position such that the second signal of the differential signal is always driven to the third node 446. In this configuration, the second transistor M2 is included to achieve symmetry with respect to the first transistor M1. In other aspects, the control signal 679 causes the second transistor M2 to be ON to cause the second signal of the differential signal to be driven to ground 349 instead of the third node 446.

In the single-ended mode, the first transistor M1 is ON such that the first signal of the differential signal is driven to ground 349 via the first transistor M1. In this configuration, the output from the driver amplifier 442 is only provided to the second path 697 to support the first load 659, the second load 661, and/or the third load 663 in accordance with the single-ended mode. For example, the single-ended output may be sampled at the second terminal 671 of the first attenuator 653, the second terminal 673 of the second attenuator 655, and/or the second terminal 675 of the third attenuator 657.

In the differential mode, the first transistor M1 is OFF and a differential output can be sampled between the second terminal 675 of the third attenuator 657 and the second terminal 687 of the fourth attenuator 681. In this configuration, the first signal of the differential signal from the driver amplifier 442 is provided to the first path 695 and the second signal of the differential signal is provided to the second path 697 to support the fourth load 693 in accordance with the differential mode.

In one aspect of the disclosure, the third attenuator 657 may be programmable to achieve the single-ended mode and the differential mode. For example, the third attenuator 657 is specified to be programmable between twenty-five (25) ohms (Ω) in the differential mode of operation or fifty (50) ohms (Ω) in the single-ended mode. In some aspects of the present disclosure, the fourth attenuator 681 is only specified to support twenty-five (25) ohms (Ω). However, to achieve symmetry with respect to the third attenuator 657, the fourth attenuator 681 may be identical to the third attenuator 657. For example, the fourth attenuator 681 may also be specified to be programmable between twenty-five (25) ohms (Ω) in the differential mode of operation or fifty (50) ohms (Ω).

The addition of transistors or switches, output ports and configurable or programmable output attenuators, allow the driver amplifier to support both differential and single-ended modes of operation.

Figure 7:
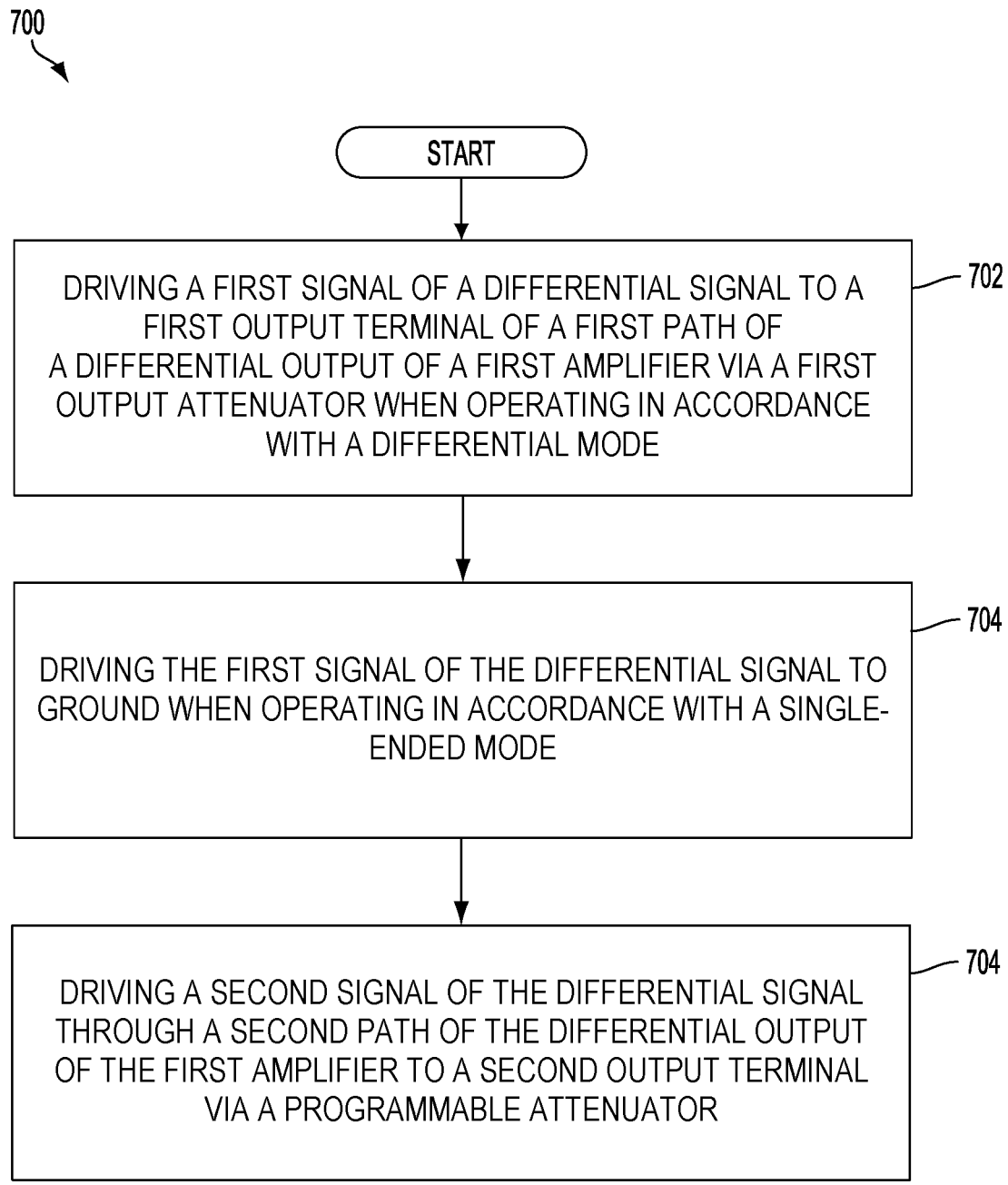
FIG. 7 depicts a simplified flowchart of a method for programmably selecting a single-ended or differential output for an output driver.

FIG. 7 depicts a simplified flowchart of a method 700 for programmably selecting a single-ended or differential driver output. At block 702, a first signal of a differential signal is driven to a first output terminal of a first path of a differential output of an amplifier via a first output attenuator when operating in a differential mode. At block 704, the first signal of the differential signal is driven to a ground when operating in a single-ended mode. At block 706, a second signal of the differential signal is driven through a second path of the differential output of the amplifier to a second output terminal via a programmable attenuator. The second signal is driven regardless of whether the amplifier is operating the differential mode or the single-ended mode.

According to one aspect of the present disclosure, an output driver with programmable single-ended and differential outputs is described. The output driver includes first means for selectively driving a first signal of a differential signal from a first amplifier to a ground or through a first path to a load coupled to the first amplifier. The output driver also includes second means for selectively driving a second signal of the differential signal from the first amplifier to the ground or through a second path to the load coupled to the first amplifier. The first driving means may, for example, be the switch M1, and/or the control signal 677. The second driving means may be, for example, the switch M2 and/or the control signal 679. In another aspect, the aforementioned means may be any module or any apparatus or material configured to perform the functions recited by the aforementioned means.

FIG. 8 is a block diagram showing an exemplary wireless communication system in which a configuration of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825B, and 825C that include the disclosed programmable transmitter. It will be recognized that other devices may also include the disclosed programmable transmitter, such as the base stations, switching devices, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the programmable transmitter.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An output driver with programmable single-ended and differential outputs, comprising:
    a transformer coupled to a differential output of a first amplifier;
    a first switch coupled in a shunt configuration to a first path of a first output of the transformer;
    a first output attenuator included in the first path, the first output attenuator coupled to the first switch in accordance with the shunt configuration; and
    a programmable attenuator included in a second path of a second output of the transformer.

2. The output driver of claim 1, further comprising a second switch coupled in a shunt configuration to the second path of the second output of the transformer.

3. The output driver of claim 2, in which the second switch is configured to be OFF and configured to achieve symmetry with the first switch.

4. The output driver of claim 1, in which the first output attenuator is programmable.

5. The output driver of claim 1, in which the first amplifier comprises a driver amplifier.

6. The output driver of claim 1, further comprising a second amplifier coupled to the first path of the first output of the transformer and/or the second path of the second output of the transformer.

7. The output driver of claim 1, in which the first switch is coupled to a node along the first path and in which the first switch is configured such that a first signal of a differential signal is driven from the first amplifier to a ground when the first switch is ON and the first signal is driven through the first path to a load coupled to the first amplifier when the first switch is OFF.

8. The output driver of claim 1, further comprising a second output attenuator in a shunt configuration to the first path and the first output attenuator.

9. The output driver of claim 8, further comprising a third output attenuator in a shunt configuration to the second path and the programmable attenuator, in which the second output attenuator is in symmetry with the third output attenuator.

10. A method for programmably selecting a single-ended or differential driver output, the method comprising:
    driving a first signal of a differential signal from a first output of a transformer to a first output terminal of a first path of a differential output of an amplifier via a first output attenuator when operating in a differential mode;

driving the first signal of the differential signal from the first output of the transformer to ground when operating in a single-ended mode; and driving a second signal of the differential signal from a second output of the transformer through a second path of the differential output of the amplifier to a second output terminal via a programmable attenuator.

11. The method of claim 10, further comprising adjusting the programmable attenuator based on whether operating in the single-ended mode or the differential mode.

12. The method of claim 10, in which the first output attenuator is programmable and the method further comprises adjusting the first output attenuator based whether operating in the single-ended mode or the differential mode.

13. An output driver with programmable single-ended and differential outputs, comprising:
    first means for selectively driving a first signal of a differential signal from a first output terminal of a transformer included in a first amplifier to a ground or from the first output terminal of a transformer included in the first amplifier through a first path to a load coupled to the first amplifier, the first driving means coupled to a first node along the first path and in a shunt configuration to the first path;
    a first output attenuator included in the first path, the first output attenuator coupled to the first driving means in accordance with the shunt configuration; and
    a programmable attenuator included in a second path of the differential output of the first amplifier.

14. The output driver of claim 13, further comprising second means for selectively driving a second signal of the differential signal from a second output terminal of the transformer included in the first amplifier to the ground or through the second output terminal of the transformer in a second path to the load coupled to the first amplifier, the second driving means coupled in a shunt configuration to the second path.

15. The output driver of claim 14, in which the second driving means is configured to be OFF and configured to achieve symmetry with the first selectively driving means.

16. The output driver of claim 13, in which the first output attenuator is programmable.

17. The output driver of claim 13, in which the first amplifier comprises a driver amplifier.

18. The output driver of claim 13, further comprising a second amplifier coupled to the first path and the second path, or to the second path.

19. The output driver of claim 13, further comprising a second output attenuator in a shunt configuration to the first path and the first output attenuator.

20. The output driver of claim 19, further comprising a third output attenuator in a shunt configuration to the second path and the programmable attenuator, in which the second output attenuator is in symmetry with the third output attenuator.

* * * * *